(12) United States Patent
Hu

(10) Patent No.: US 9,755,628 B2
(45) Date of Patent: Sep. 5, 2017

(54) DRIVING CIRCUIT, CONVERTER AND DRIVING METHOD

(71) Applicant: DELTA ELECTRONICS, INC., Taoyuan (TW)

(72) Inventor: Chih-I Hu, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 50 days.

(21) Appl. No.: 14/989,810

(22) Filed: Jan. 7, 2016

(65) Prior Publication Data

US 2017/0201246 A1    Jul. 13, 2017

(51) Int. Cl.
| | | |
|---|---|---|
| G05F 1/56 | (2006.01) | |
| G05F 5/00 | (2006.01) | |
| H03K 17/042 | (2006.01) | |
| H03K 5/24 | (2006.01) | |
| H02M 3/156 | (2006.01) | |

(52) U.S. Cl.
CPC ...... *H03K 17/04206* (2013.01); *H02M 3/156* (2013.01); *H03K 5/24* (2013.01)

(58) Field of Classification Search
CPC .... H02M 3/156; H02M 3/155; H02M 3/1563; G05F 1/562; G05F 1/56; G05F 1/575; G05F 5/00; G05F 3/10; G05F 3/16
USPC ........ 323/274, 282, 284, 303, 311, 314, 351
See application file for complete search history.

(56) References Cited

U.S. PATENT DOCUMENTS

| | | | | |
|---|---|---|---|---|
| 5,712,556 A | * | 1/1998 | Okamura | ................ G05F 3/242 323/314 |
| 6,087,885 A | * | 7/2000 | Tobita | ................ H03K 19/0005 327/379 |
| 6,297,624 B1 | * | 10/2001 | Mitsui | ..................... G05F 1/465 323/314 |
| 7,233,191 B2 | | 6/2007 | Wang et al. | |
| 9,590,494 B1 | * | 3/2017 | Zhou | ..................... G01R 1/203 |
| 2010/0091597 A1 | * | 4/2010 | Matano | .................. G11C 5/147 365/226 |
| 2012/0049632 A1 | * | 3/2012 | Sato | ....................... B41J 2/0451 307/80 |

(Continued)

FOREIGN PATENT DOCUMENTS

| | | |
|---|---|---|
| CN | 1835652 A | 9/2006 |
| TW | I439988 B | 6/2014 |

*Primary Examiner* — Adolf Berhane
(74) *Attorney, Agent, or Firm* — CKC & Partners Co., Ltd.

(57) ABSTRACT

A driving circuit includes a main output terminal electrically coupled to a switch element, a first voltage generating circuit and a second voltage generating circuit. The first voltage generating circuit is electrically coupled with the main output terminal. The first voltage generating circuit comprises a first comparator and a voltage divider circuit. The first voltage generating circuit is configured to generate a first voltage at the main output terminal during a predetermined time interval of a turn-on duration of a switching period. The second voltage generating circuit is electrically coupled with the main output terminal. The second voltage generating circuit is configured to generate a second voltage at the main output terminal during a remaining time interval of the turn-on duration of the switching period. The predetermined time interval is ahead of the remaining time interval, and the first voltage is higher than the second voltage.

18 Claims, 9 Drawing Sheets

(56) References Cited

U.S. PATENT DOCUMENTS

| | | | |
|---|---|---|---|
| 2014/0021934 A1* | 1/2014 | Wu | H02M 3/156 |
| | | | 323/311 |
| 2014/0292395 A1* | 10/2014 | Wu | H01L 21/28264 |
| | | | 327/434 |
| 2015/0015224 A1* | 1/2015 | Yasusaka | G05F 1/575 |
| | | | 323/280 |
| 2015/0263679 A1* | 9/2015 | Itakura | H03F 1/308 |
| | | | 330/296 |

* cited by examiner

DRIVING CIRCUIT, CONVERTER AND DRIVING METHOD

BACKGROUND

Technical Field

The present disclosure relates to a driving circuit, a converter and a driving method. More particularly, the present disclosure relates to a driving circuit, a converter and a driving method that may speed up driving velocity of a switch element.

Description of Related Art

The current technology is such that a square wave is configured to drive a semiconductor switch element. When the square wave is fixed, a turn-on speed of the semiconductor switch element is fixed. Accordingly, the turn-on speed of the semiconductor switch element is hard to speed up.

SUMMARY

The present disclosure provides a driving circuit and a driving method to solve the foregoing problems.

One embodiment of the present disclosure is related to a driving circuit. The driving circuit is for driving a switch element. The driving circuit includes a main output terminal, a first voltage generating circuit and a second voltage generating circuit. The main output terminal is electrically coupled to the switch element. The first voltage generating circuit is electrically coupled with the main output terminal. The first voltage generating circuit includes a first comparator and a voltage divider circuit electrically coupled with the first comparator. The first voltage generating circuit is configured to generate a first voltage at the main output terminal during a predetermined time interval of a turn-on duration of a switching period. The second voltage generating circuit is electrically coupled with the main output terminal. The second voltage generating circuit is configured to generate a second voltage at the main output terminal during a remaining time interval of the turn-on duration of the switching period. The second voltage is higher than a threshold voltage of the switch element. The predetermined time interval is ahead of the remaining time interval, and the first voltage is higher than the second voltage.

One embodiment of the present disclosure is related to a converter. The converter includes a nitride-based transistor and a driving circuit. The driving circuit includes a main output terminal, a first voltage generating circuit, and a second voltage generating circuit. The main output terminal is electrically coupled with a gate electrode of the nitride-based transistor. The first voltage generating circuit is electrically coupled with the main output terminal. The first voltage generating circuit is configured to generate a first voltage at the main output terminal during a predetermined time interval of a turn-on duration of a switching period. The second voltage generating circuit is electrically coupled with the main output terminal. The second voltage generating circuit is configured to generate a second voltage at the main output terminal for turning on the nitride-based transistor during a remaining time interval of the turn-on duration of the switching period. The predetermined time interval is ahead of the remaining time interval. The second voltage is lower than the first voltage.

One embodiment of the present disclosure is related to a method for driving a nitride-based transistor. The method includes steps: providing a driving circuit including a first voltage generating circuit and a second voltage generating circuit; and turning on the nitride-based transistor by providing a first voltage and a second voltage to the nitride-based transistor in sequence. The first voltage is generated by the first voltage generating circuit during a predetermined time interval. The second voltage is generated by the second voltage generating circuit during a remaining time interval. The remaining time interval is after the predetermined time interval. The second voltage is lower than the first voltage but higher than a threshold voltage of the nitride-based transistor.

In view of the above, the driving circuit in the aforementioned embodiment outputs a first voltage having a higher voltage before outputting a second voltage having a lower voltage. The first voltage is provided to a switch element such that the switch element has a faster turn-on speed, and the second voltage is provided to the switch element such that the switch element has a stable driving voltage after it is turned on.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
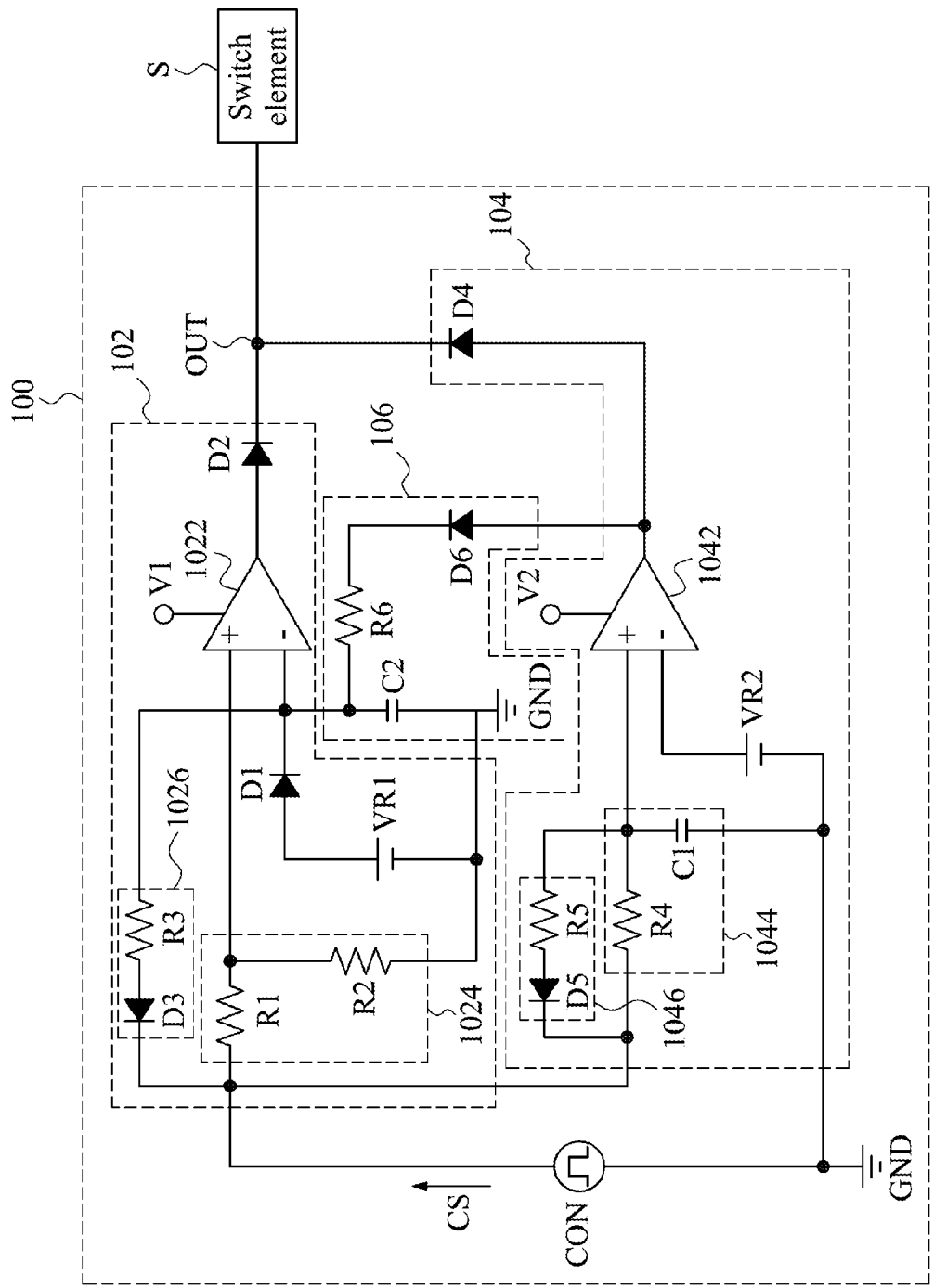
FIG. 1 is a block diagram illustrating a driving circuit and a switch element according to one embodiment of the present disclosure.

The present disclosure will now be described more fully hereinafter with reference to the accompanying drawings, in which exemplary embodiments of the disclosure are shown. This disclosure may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Figure 2:
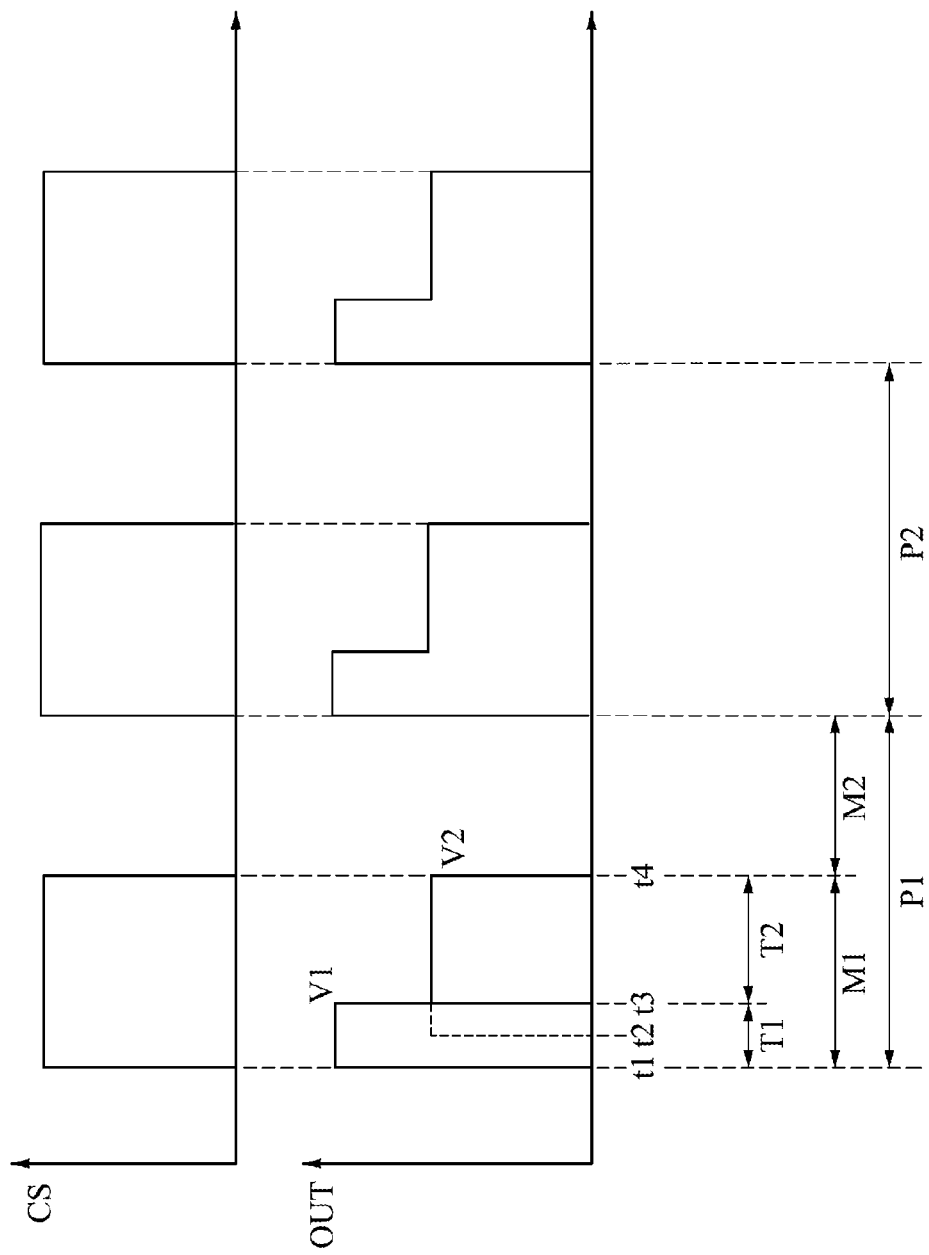
FIG. 2 is a waveform diagram of a control signal and a voltage of a main output terminal of the driving circuit of FIG. 1.

FIG. 1 is a block diagram illustrating a driving circuit 100 and a switch element S according to one embodiment of the present disclosure. FIG. 2 is a waveform diagram of a control signal CS and a voltage of a main output terminal OUT of the driving circuit 100 of FIG. 1.

In some embodiments, signals outputted at the main output terminal OUT of the driving circuit 100 are configured to drive the switch element S. As illustrated in FIG. 1, the main output terminal OUT of the driving circuit 100 is electrically coupled to the switch element S. In some embodiments, the switch element S is a nitride-based semiconductor device, such as a III-N transistor. The main output terminal OUT is electrically coupled with a gate electrode of the III-N transistor. In an embodiment, the switch element S is an enhanced-mode (E-mode) GaN transistor, and the main output terminal OUT is electrically connected to a gate electrode of the GaN transistor. In some embodiments, the driving circuit 100 and the switch element S are included in a converter C.

As illustrated in FIG. 1 and FIG. 2, the driving circuit 100 includes a main output terminal OUT, a first voltage generating circuit 102 and a second voltage generating circuit 104. The first voltage generating circuit 102 is electrically coupled with the main output terminal OUT, and the second voltage generating circuit 104 is also electrically coupled with the main output terminal OUT. The first voltage generating circuit 102 is configured to generate a first voltage V1 at the main output terminal OUT during a predetermined time interval T1 of a turn-on duration M1 of a switching period P1. The second voltage generating circuit 104 is configured to generate a second voltage V2 at the main output terminal OUT during a remaining time interval T2 of the turned-on duration M1 of the switching period P1. The predetermined time interval T1 is ahead of the remaining time interval T2, and the first voltage V1 is higher than the second voltage V2. In some embodiments, the first voltage is 5-20V, and the second voltage V2 is 2-10V. In another embodiment, the second voltage V2 is lower than a half of the first voltage V1, but still higher than a threshold voltage of the switch element S to remain the switch element S being turned-on. It is note that these voltages can be designed according to a requirement of product.

Consequently, the driving circuit 100 may output the first voltage V1 that is higher before outputting the second voltage V2 that is lower. The first voltage V1 is provided to the switch element S (such as a GaN switch transistor) such that the switch element S has a faster turn-on speed, and the second voltage V2 is provided to the switch element S, such that the switch element S has a stable driving voltage after it is turned on.

A detailed description of the driving circuit 100 will now be provided. As illustrated in FIG. 1, in some embodiments, the first voltage generating circuit 102 includes a first comparator 1022, a voltage divider circuit 1024 and a first reference voltage source VR1. The first comparator 1022 has a positive input terminal, a negative input terminal and an output terminal. The output terminal of the first comparator 1022 is electrically coupled with the main output terminal OUT. The voltage divider circuit 1024 is electrically coupled with the positive input terminal of the first comparator 1022, and the first reference voltage source VR1 and a first diode D1 are coupled in series at the negative input terminal of the first comparator 1022. In some embodiments, the first comparator 1022 further includes a first voltage input terminal. When the voltage at the positive input terminal of the first comparator 1022 is higher than the voltage at the negative input terminal of the first comparator 1022, the first voltage V1 may be transmitted from the first voltage input terminal to the output terminal of the first comparator 1022.

In some embodiments, the voltage divider circuit 1024 includes a first resistor R1 and a second resistor R2. The first resistor R1 and the second resistor R2 are coupled in series at the positive input terminal of the first comparator 1022. In greater detail, a first terminal of the first resistor R1 is electrically coupled with a control signal source CON, and a second terminal of the first resistor R1 is electrically coupled with the positive input terminal of the first comparator 1022. The second terminal of the first resistor R1 is electrically coupled with a first terminal of the second resistor R2, and a second terminal of the second resistor R2 is electrically coupled with ground GND.

The control signal source CON may be configured to output a control signal CS. The control signal CS may be, for example, a pulse width modulation (PWM) signal, such as the control signal CS illustrated in FIG. 2.

In some embodiments, the first voltage generating circuit 102 further includes a second diode D2, and the second diode D2 is electrically coupled between the output terminal of the first comparator 1022 and the main output terminal OUT.

In some embodiments, the first voltage generating circuit 102 further includes a first discharge path 1026. The first discharge path 1026 includes a third diode D3 and a third resistor R3. The third resistor R3 and the third diode D3 are coupled in series between the first diode D1 and the ground GND.

In some embodiments, the second voltage generating circuit 104 includes a second comparator 1042, a charge circuit 1044 and a second reference voltage source VR2. The second comparator 1042 has a positive input terminal, a negative input terminal and an output terminal. The charge circuit 1044 is electrically coupled with the positive input terminal of the second comparator 1042, and the second reference voltage source VR2 is electrically coupled with the negative terminal of the second comparator 1042. In some embodiments, the second comparator 1042 further includes a second voltage input terminal. When the voltage at the positive input terminal of the second comparator 1042 is higher than the voltage at the negative input terminal of the second comparator 1042, the second voltage V2 may be transmitted from the second voltage input terminal to the output terminal of the second comparator 1042.

In some embodiments, the charge circuit 1044 includes a fourth resistor R4 and a first capacitor C1. A first terminal of the fourth resistor R4 is electrically coupled with the positive input terminal of the second comparator 1042, and a second terminal of the fourth resistor R4 is electrically coupled with the control signal source CON. A first terminal of the first capacitor C1 is electrically coupled with the first terminal of the fourth resistor R4, and a second terminal of the first capacitor C1 is electrically coupled with the ground GND.

In some embodiments, the second voltage generating circuit 104 further includes a fourth diode D4. The fourth diode D4 is electrically coupled between the output terminal of the second comparator 1042 and the main output terminal OUT.

In some embodiments, the second voltage generating circuit 104 further includes a second discharge path 1046. The second discharge path 1046 includes a fifth diode D5 and a fifth resistor R5. The fifth resistor R5 and the fifth diode D5 are electrically coupled between the positive input terminal of the second comparator 1042 and the ground GND.

In some embodiments, the driving circuit 100 further includes a hysteresis path 106. The hysteresis path 106 is electrically coupled between the output terminal of the second comparator 1042 and the negative input terminal of the first comparator 1022. The hysteresis path 106 is configured to generate a pull-low voltage being higher than the positive input terminal of the first comparator 1022 to the negative input terminal of the first comparator 1022 according to the second voltage V2 outputted from the second comparator 1042, such that the output terminal of the first comparator 1022 is pulled low.

In some embodiments, as illustrated in FIG. 1, the hysteresis path 106 includes a sixth diode D6, a sixth resistor R6 and a second capacitor C2. A first terminal of the second capacitor C2 is electrically coupled with the negative input terminal of the first comparator 1022, and a second terminal of the second capacitor C2 is electrically coupled with the ground GND. The sixth resistor R6 and the sixth diode D6 are coupled in series between the first terminal of the second capacitor C2 and the output terminal of the second comparator 1042.

Figure 3:
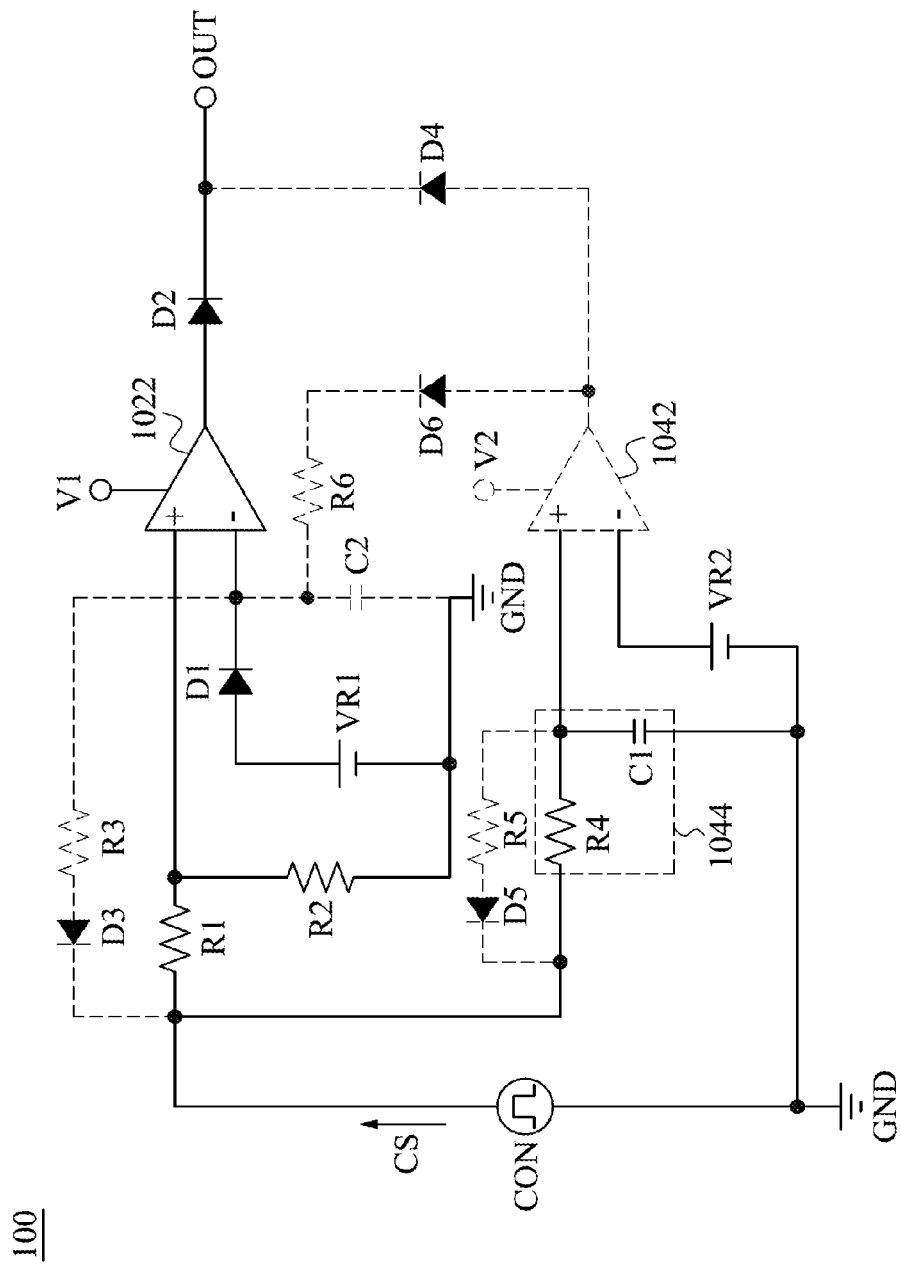
FIG. 3 is a schematic diagram illustrating the driving circuit of FIG. 1 in a first operating mode.

FIG. 3 is a schematic diagram illustrating the driving circuit 100 of FIG. 1 in a first operating mode. The first operating mode occurs from a first time t1 to a second time t2 in FIG. 2.

As illustrated in FIG. 2 and FIG. 3, from the first time t1 to the second time t2, the control signal CS generated by the control signal source CON has a high level, and the control signal CS is divided by the first resistor R1 and the second resistor R2 and generates a divided voltage. The divided voltage is transmitted to the positive input terminal of the first comparator 1022. The voltage (for example, 2.5V) of the first reference voltage source VR1 may be transmitted to the negative input terminal of the first comparator 1022 through the first diode D1. By designing appropriately the resistances of the first resistor R1 and the second resistor R2, the divided voltage transmitted to the positive terminal of the first comparator 1022 is made higher than the voltage at the negative input terminal of the first comparator 1022. At this time, the first voltage V1 is transmitted to the output terminal of the first comparator 1022, and then the first voltage V1 may be transmitted to the main output terminal OUT through the second diode D2.

Moreover, the control signal CS is also transmitted to the charge circuit 1044. At this time, the control signal CS charges the first capacitor C1 of the charge circuit 1044. However, the fourth resistor R4 and the first capacitor C1 have an RC-delay, and therefore, by designing appropriately the fourth resistor R4 and the first capacitor C1, the voltage at the first terminal of the first capacitor C1 is made lower than the voltage of the second reference voltage source VR2. At this time, the second comparator 1042 is still pulled low, and the voltage at the main output terminal OUT is the first voltage V1.

Figure 4:
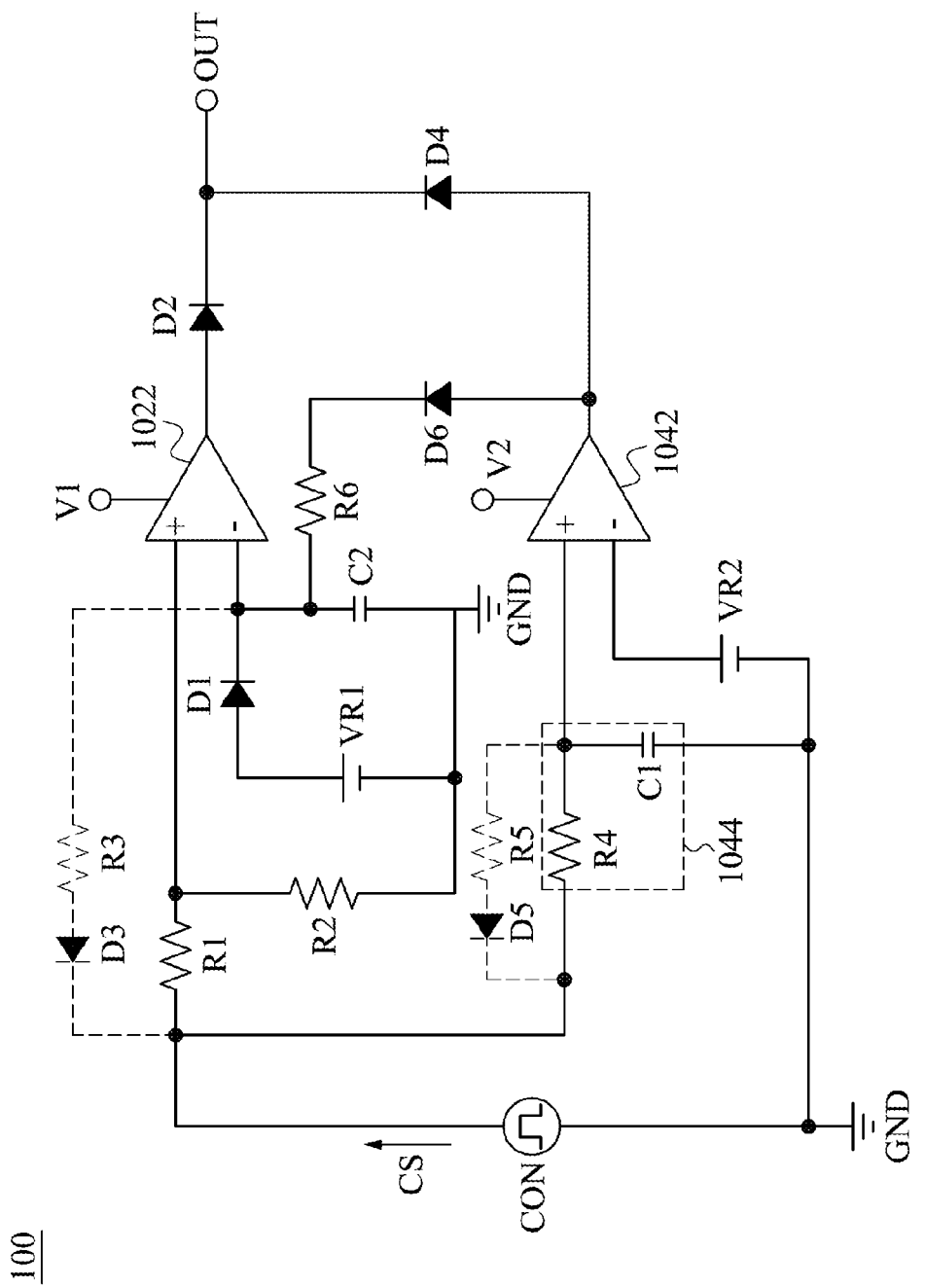
FIG. 4 is a schematic diagram illustrating the driving circuit of FIG. 1 in a second operating mode.

FIG. 4 is a schematic diagram illustrating the driving circuit 100 of FIG. 1 in a second operating mode. The second operating mode occurs from second the time t2 to a third time t3 in FIG. 2.

As illustrated in FIG. 2 and FIG. 4, from the second time t2 to the third time t3, the control signal CS still has a high level, so that the first comparator 1022 still outputs the first voltage V1 to the main output terminal OUT.

In addition, the control signal CS is still transmitted to the charge circuit 1044 so as to continue to charge the first capacitor C1. By designing appropriately the fourth resistor R4 and the first capacitor C1, the voltage at the first terminal of the first capacitor C1 is charged to a voltage which is higher than the voltage of the second reference voltage source VR2. At this time, the voltage at the positive input terminal of the second comparator 1042 is higher than the voltage at the negative terminal of the second comparator 1042. Therefore, the second voltage V2 may be transmitted to the output terminal of the second comparator 1042 and transmitted to the main output terminal OUT through the fourth diode D4.

Consequently, from the second time t2 to the third time t3, the first voltage V1 and the second voltage V2 are both transmitted to the main output terminal OUT. Because the first voltage V1 is higher than the second voltage V2, the voltage at the main output terminal OUT is the first voltage V1.

In addition, the second voltage V2 at the output terminal of the second comparator 1042 also charges the second capacitor C2 through the sixth diode D6 and the sixth resistor R6. The sixth resistor R6 and the second capacitor C2 have an RC-delay, and therefore, by designing appropriately the sixth resistor R6 and the second capacitor C2, the voltage at the first terminal of the second capacitor C2 (i.e., the voltage at the negative input terminal of the first comparator 1022) is made lower than the voltage at the positive input terminal of the first comparator 1022 before the third time t3. Therefore, the output terminal of the first comparator 1022 will not be pulled low before the third time t3.

The first voltage V1 and the second voltage V2 are transmitted to the main output terminal OUT from the second time t2 to the third time t3, and this prevents the first comparator 1022 from being turned off before the second voltage V2 has not yet transmitted to the main output terminal OUT.

In addition, the second diode D2 and the fourth diode D4 are configured to prevent the voltage signal at the main output terminal OUT from being transmitted back to the first comparator 1022 and the second comparator 1042. If the voltage signal at the main output terminal OUT is transmitted back to the first comparator 1022 and the second comparator 1042, the first comparator 1022 and the second comparator 1042 are unable to operate normally.

Figure 5:
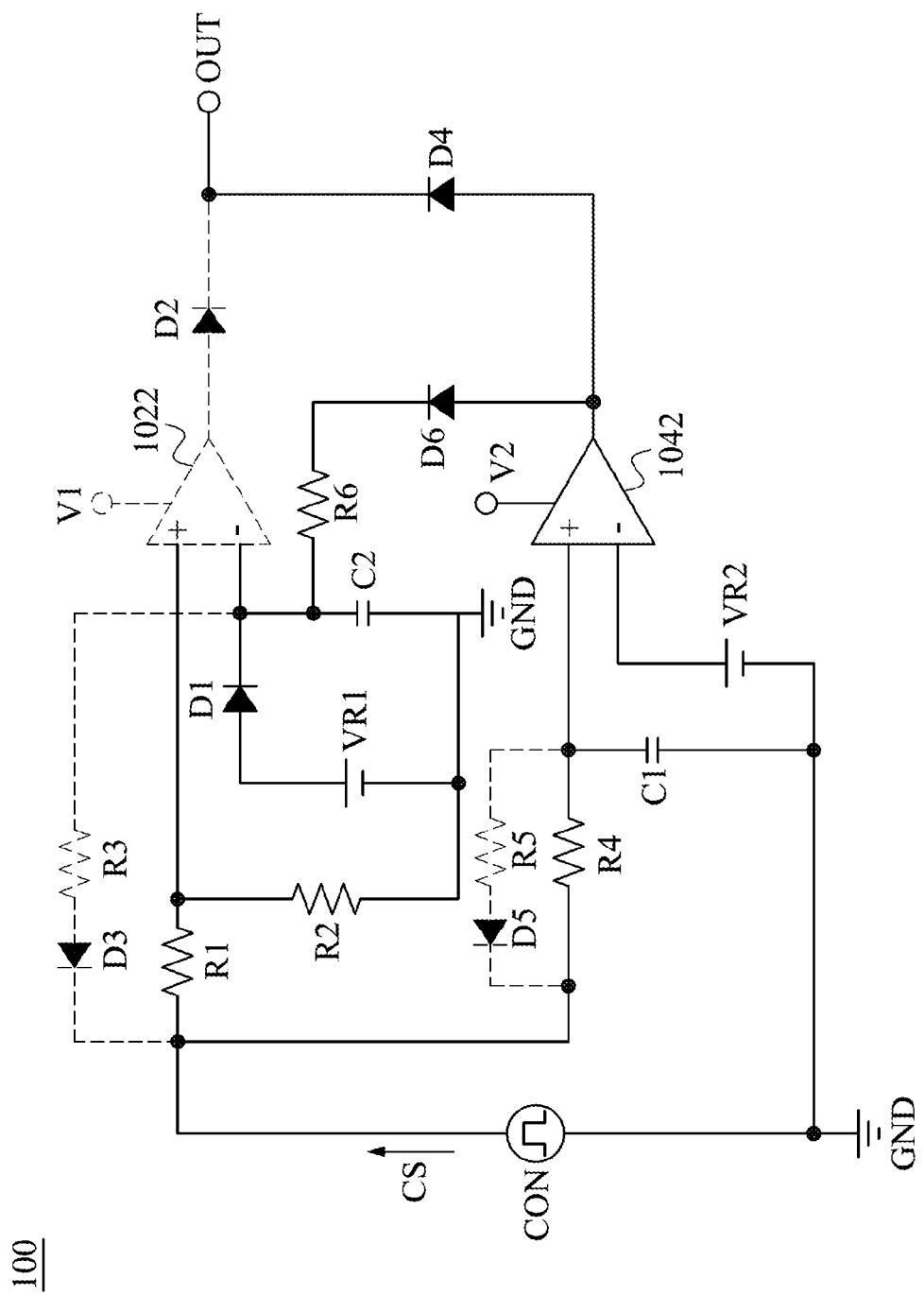
FIG. 5 is a schematic diagram illustrating the driving circuit of FIG. 1 in a third operating mode.

FIG. 5 is a schematic diagram illustrating the driving circuit 100 of FIG. 1 in a third operating mode. The third operating mode occurs from the third time t3 to a fourth time t4 in FIG. 2, that is, during the remaining time interval T2 of the turn-on duration M1.

As illustrated in FIG. 2 and FIG. 5, from the third time t3 to the fourth time t4, the control signal CS still has a high level. By designing appropriately the sixth resistor R6 and the second capacitor C2, the voltage at the first terminal of the second capacitor C2 (i.e., the voltage at the negative input terminal of the first comparator 1022) is charged to be higher than the voltage at the positive input terminal of the first comparator 1022 at the third time t3. At this time, because the voltage at the negative input terminal of the first comparator 1022 (i.e., the above-mentioned pull-low voltage) is higher than the voltage at the positive input terminal of the first comparator 1022, the output terminal of the first comparator 1022 is pulled low. Consequently, the first voltage V1 will not be transmitted to the output terminal of the first comparator 1022 and the voltage of the main output terminal OUT changes to the second voltage V2.

The first diode D1 may be configured to prevent the second voltage V2 outputted by the second comparator 1042 from affecting the voltage of the first reference voltage source VR1. In addition, the sixth diode D6 may be configured to prevent the voltage of the first reference voltage source VR1 from being transmitted to the main output terminal OUT through the first diode D1, the sixth resistor R6 and the fourth diode D4.

Figure 6:
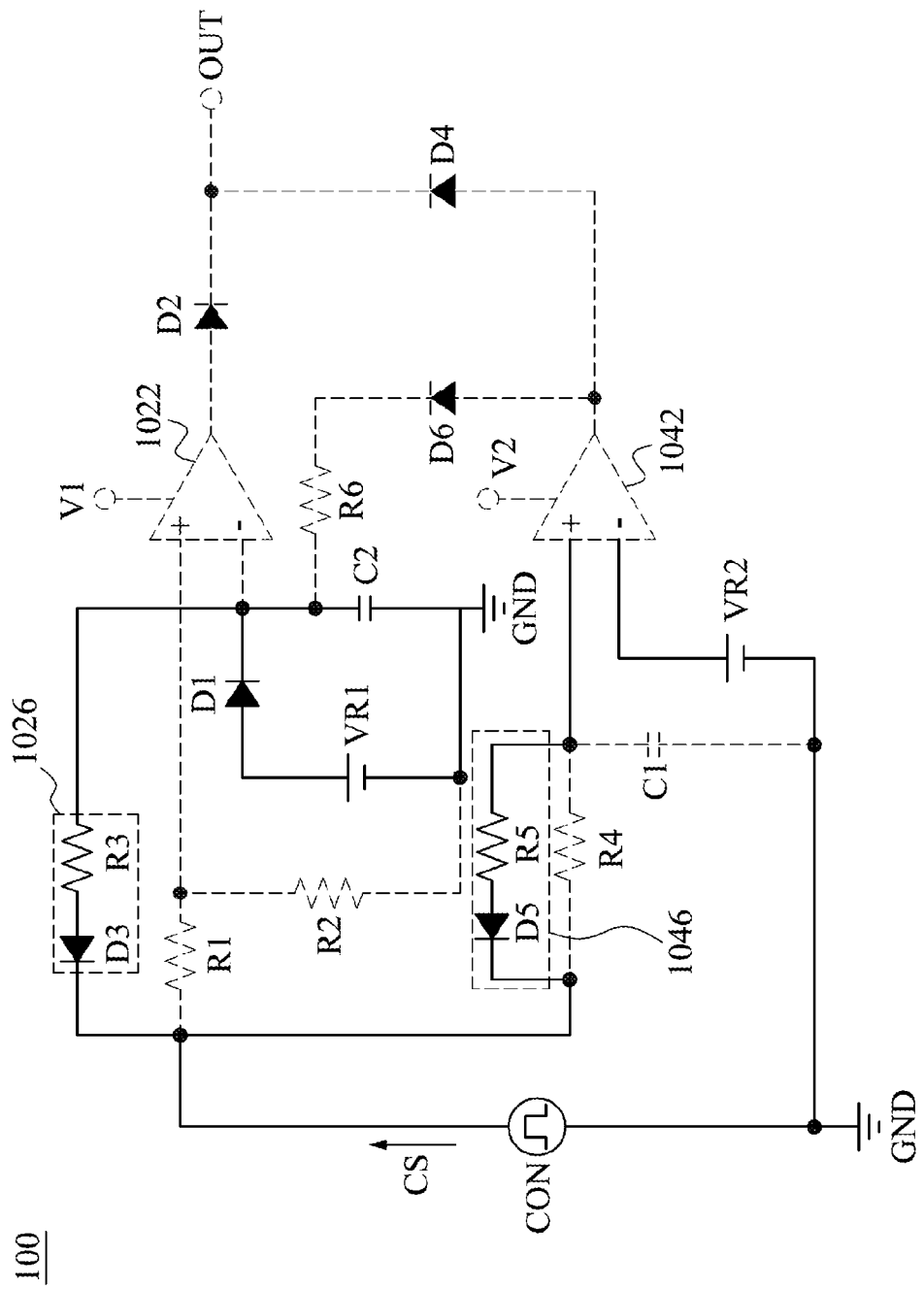
FIG. 6 is a schematic diagram illustrating the driving circuit of FIG. 1 in a fourth operating mode.

FIG. 6 is a schematic diagram illustrating the driving circuit 100 of FIG. 1 in a fourth operating mode. The fourth operating mode occurs between the fourth time t4 and the next switching period P2 (second switching period P2) in FIG. 2, that is, the turn-off duration M2 of the switching period P1.

As illustrated in FIG. 2 and FIG. 6, the control signal CS changes to have a low level (0V) in the turn-off duration M2. At this time, the first comparator 1022 remains in a pull-low state. The voltage of the first reference voltage source VR1 is discharged to ground GND through the first diode D1 and the first discharge path 1026 to avoid malfunctioning of the first comparator 1022. In addition, the voltage at the first terminal of the second capacitor C2 (i.e., the voltage at the negative input terminal of the first comparator 1022) may also be discharged to ground GND through the first discharge path 1026, such that the driving circuit 100 enters the next period. The third resistor R3 is configured to limit the current flowing through the third diode D3 to prevent the power of the third diode D3 from being too large.

On the other hand, the voltage on the first capacitor C1 may be discharged to ground GND through the second discharge path 1046, such that the output terminal of the second comparator 1042 is pulled low and no longer outputs the second voltage V2. The fifth resistor R5 is configured to limit the current flowing through the fifth diode D5 to prevent the power of the fifth diode D5 from being too large.

Consequently, the first comparator 1022 and the second comparator 1042 are pulled low, such that the first voltage V1 and the second voltage V2 are not transmitted to the main output terminal OUT. As a result, the voltage at the main output terminal is zero.

Figure 7:
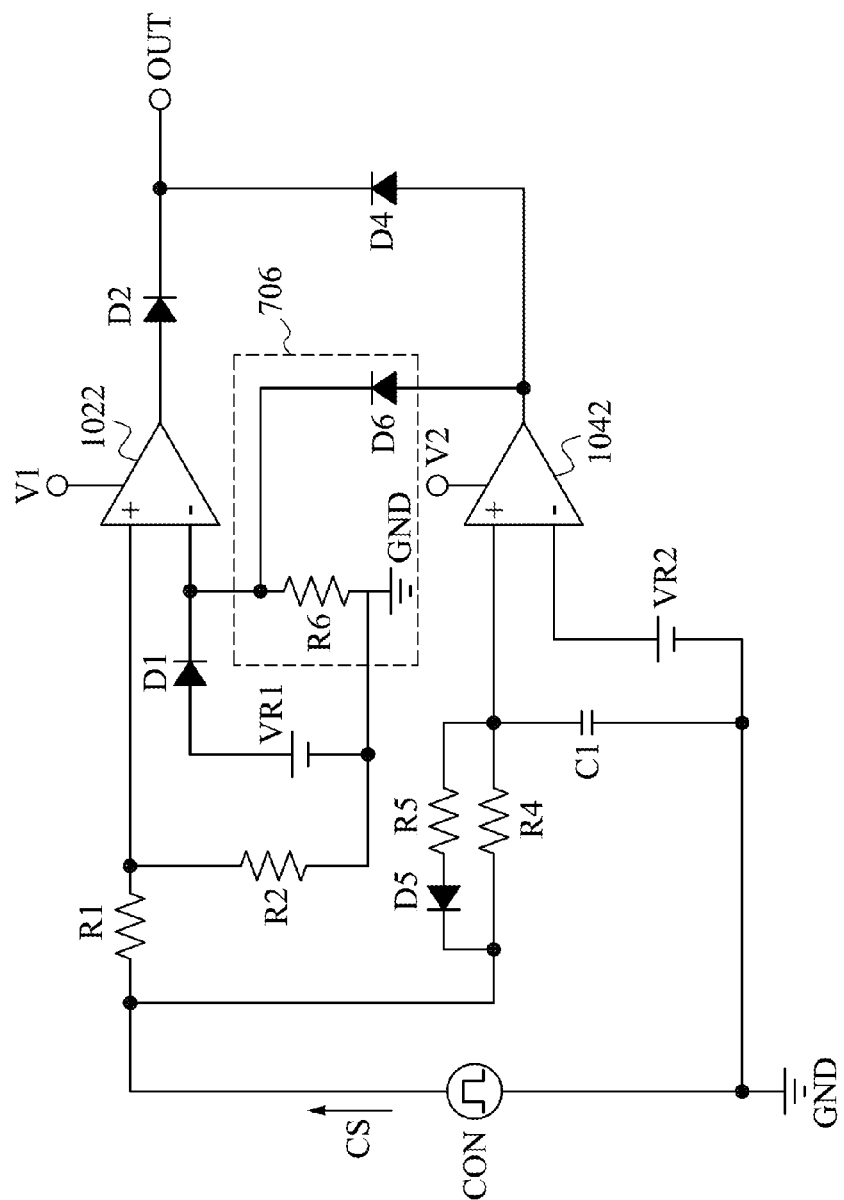
FIG. 7 is a block diagram illustrating a driving circuit according to another embodiment of this disclosure.

FIG. 7 is a block diagram illustrating a driving circuit 200 according to another embodiment of this disclosure. The difference between the driving circuit 200 in FIG. 7 and the driving circuit 100 in FIG. 1 is that the driving circuit 200 doesn't have the first discharge path 1026 as illustrated in FIG. 1, and the hysteresis path 706 of the driving circuit 200 only includes the sixth diode D6 and the sixth resistor R6.

The first terminal of the sixth resistor R6 is electrically coupled with the negative input terminal of the first comparator 1022, and the second terminal of the sixth resistor R6 is electrically coupled with ground GND. The sixth diode D6 is electrically coupled between the first terminal of the sixth resistor R6 and the output terminal of the second comparator 1042. Because the hysteresis path 706 is without a capacitor, the second voltage V2 is immediately transmitted to the negative input terminal of the first comparator 1022 though the sixth diode D6 when the voltage of the output terminal of the second comparator 1042 is the second voltage V2, such that the first comparator 1022 is immediately turned off and stops outputting the first voltage V1. Consequently, the first voltage V1 and the second voltage V2 cannot be transmitted to the main output terminal OUT simultaneously.

Figure 8:
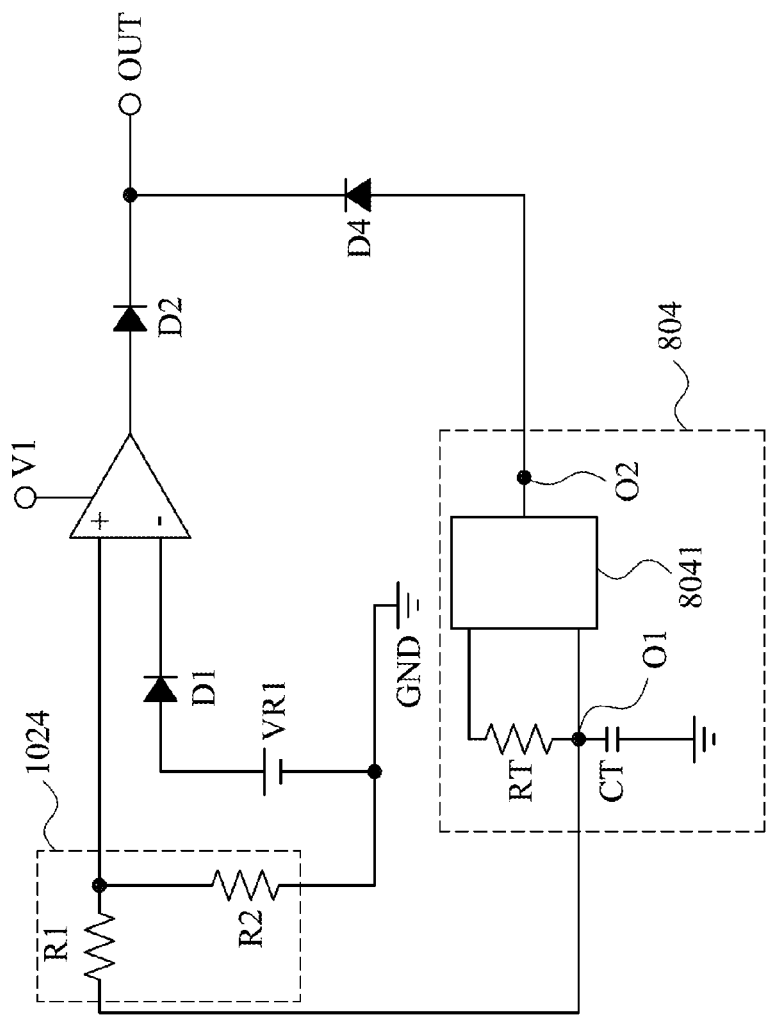
FIG. 8 is a block diagram illustrating a driving circuit according to yet another embodiment of this disclosure.

FIG. 8 is a block diagram illustrating a driving circuit 300 according to yet another embodiment of this disclosure. The difference between the driving circuit 300 in FIG. 8 and the driving circuit 200 in FIG. 7 is that the driving circuit 300 doesn't have the control signal source CON as illustrated in FIG. 7 and the second voltage generating circuit 804 includes a current-mode controller 8041. The current-mode controller 8041 includes a first output terminal O1 and a second output terminal O2. The first output terminal O1 is electrically coupled with the voltage divider circuit 1024, and the second output terminal O2 is electrically coupled with the main output terminal OUT. The current-mode controller 8041 may operate in coordination with a control resistor RT and a control capacitor CT, and be configured to output a control signal at the first output terminal O1. The control signal is transmitted to the voltage divider circuit 1024, such that the first comparator 1022 utilizes the same operating principle as in FIG. 1 to transmit the first voltage V1 to the main output terminal OUT. After a period of time, the current-mode controller 8041 may output the second voltage V2 at the second output terminal O2. The second voltage V2 is then transmitted to the main output terminal OUT. Consequently, the main output terminal OUT of the driving circuit 300 also may generate the first voltage V1 having a higher voltage before generating the second voltage V2.

Figure 9:
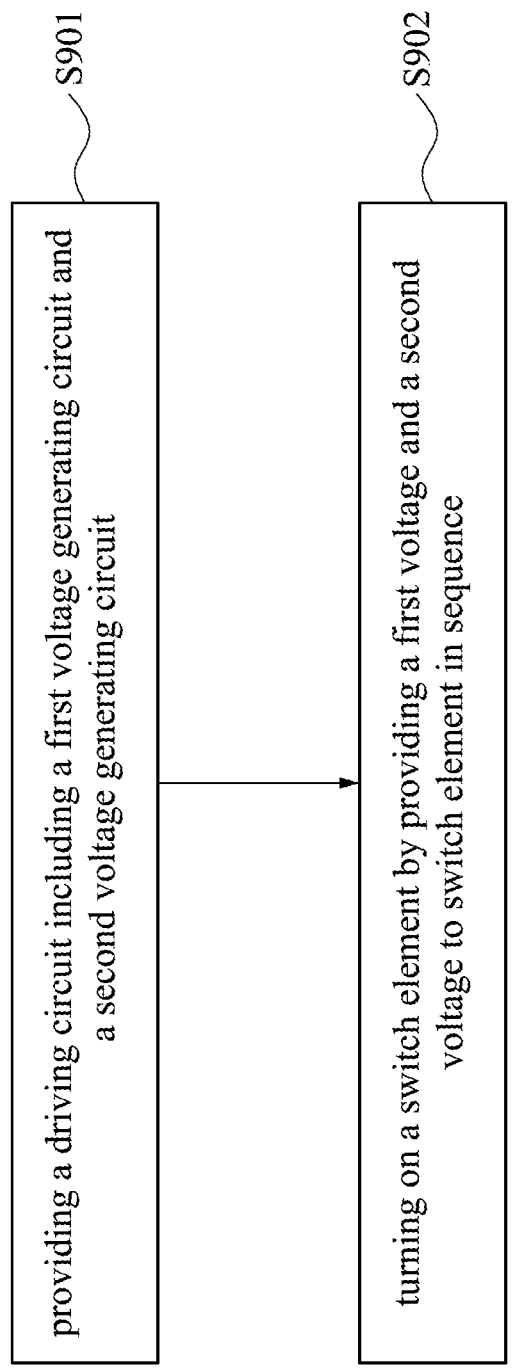
FIG. 9 is a flow diagram illustrating a driving method according to one embodiment of this disclosure.

FIG. 9 is a flow diagram illustrating a driving method 900 according to one embodiment of this disclosure. As illustrated in FIG. 9, the driving method 900 includes steps S901 and S902. In some embodiments, the driving method 900 is configured to drive a nitride-based transistor. In other words, in these embodiments, the switch element S in FIG. 1 is the nitride-based transistor.

The step S901 is for providing a driving circuit 100 in FIG. 1. The driving circuit 100 includes a first voltage generating circuit 102 and a second voltage generating circuit 104.

The step S902 is for turning on the switch element S by providing a first voltage V1 and a second voltage V2 to the switch element S in sequence.

A detailed description about the driving method 900 has been provided in the above subparagraphs, so it will not be provided again.

In view of the above, the driving circuit in the aforementioned embodiment outputs a first voltage having a higher voltage before outputting a second voltage having a lower voltage. The first voltage is provided to a switch element such that the switch element has a faster turn-on speed, and the second voltage is provided to the switch element such that the switch element has a stable driving voltage after it is turned on.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A driving circuit for driving a switch element, comprising:
    a main output terminal electrically coupled to the switch element;
    a first voltage generating circuit electrically coupled with the main output terminal, wherein the first voltage generating circuit comprises a first comparator and a voltage divider circuit electrically coupled with the first comparator, and the first voltage generating circuit is configured to generate a first voltage at the main output terminal during a predetermined time interval of a turn-on duration of a switching period; and
    a second voltage generating circuit electrically coupled with the main output terminal, wherein the second voltage generating circuit is configured to generate a second voltage at the main output terminal during a remaining time interval of the turn-on duration of the switching period, and the second voltage is higher than a threshold voltage of the switch element;
    wherein the predetermined time interval is ahead of the remaining time interval, and the first voltage is higher than the second voltage, and wherein the first comparator has a positive input terminal, a negative input terminal and an output terminal, the voltage divider circuit is electrically coupled with the positive input terminal of the first comparator, the first voltage generating circuit further comprises a first reference voltage source, and the first reference voltage source is coupled in series with a first diode at the negative input terminal of the first comparator.

2. The driving circuit of claim 1, wherein the voltage divider circuit comprises a first resistor and a second resistor coupled in series at the positive input terminal of the first comparator, and the first voltage generating circuit further comprises a second diode electrically coupled with the output terminal of the first comparator.

3. The driving circuit of claim 1, wherein the first voltage generating circuit further comprises a first discharge path, the first discharge path comprising:
 a third diode; and
 a third resistor coupled in series with the third diode between the first diode and ground.

4. The driving circuit of claim 1, wherein the second voltage generating circuit comprises:
 a second comparator having a positive input terminal, a negative input terminal and an output terminal;
 a charge circuit electrically coupled with the positive input terminal of the second comparator; and
 a second reference voltage source electrically coupled with the negative input terminal of the second comparator.

5. The driving circuit of claim 4, wherein the charge circuit comprises a fourth resistor and a first capacitor, a terminal of the fourth resistor is electrically coupled with the positive input terminal of the second comparator, the first capacitor is electrically coupled between the terminal of the fourth resistor and ground, the second voltage generating circuit further comprises a fourth diode, and the fourth diode is electrically coupled with the output terminal of the second comparator.

6. The driving circuit of claim 4, wherein the second voltage generating circuit further comprises a second discharge path, the second discharge path comprises:
 a fifth diode; and
 a fifth resistor coupled in series with the fifth diode between the positive input terminal of the second comparator and ground.

7. The driving circuit of claim 1, further comprising a hysteresis path, wherein the hysteresis path is configured to generate a turn-off voltage according to the second voltage, and output the turn-off voltage to a negative input terminal of the first comparator of the first voltage generating circuit.

8. The driving circuit of claim 4, further comprising a hysteresis path, wherein the hysteresis path is electrically coupled between the output terminal of the second comparator of the second voltage generating circuit and a negative input terminal of the first comparator of the first voltage generating circuit.

9. The driving circuit of claim 8, wherein the hysteresis path comprises a sixth diode, a sixth resistor and a second capacitor, wherein a first terminal of the second capacitor is electrically coupled with the negative input terminal of the first comparator, a second terminal of the second capacitor is electrically coupled with a ground, and the sixth resistor and the sixth diode are electrically coupled in series between the first terminal of the second capacitor and the output terminal of the second comparator.

10. The driving circuit of claim 8, wherein the hysteresis path comprises a sixth diode and a sixth resistor, a first terminal of the six resistor is electrically coupled with a negative input terminal of the first comparator, a second terminal of the sixth resistor is electrically coupled with a ground, and the sixth diode is coupled between the first terminal of the sixth resistor and the output terminal of the second comparator.

11. The driving circuit of claim 1, wherein the second voltage generating circuit comprises a current-mode controller.

12. The driving circuit of claim 11, wherein the current-mode controller comprises a first output terminal and a second output terminal, the first output terminal is electrically coupled with the first voltage generating circuit, and the second output terminal is electrically coupled with the main output terminal.

13. The driving circuit of claim 12, wherein the first output terminal is electrically coupled with a control resistor and a control capacitor.

14. The driving circuit of claim 12, wherein the first output terminal is configured to output a control signal to the voltage divider circuit of the first voltage generating circuit.

15. The driving circuit of claim 12, wherein the second output terminal is configured to output the second voltage.

16. A converter, comprising:
 a nitride-based transistor; and
 a driving circuit, wherein the driving circuit comprises:
 a main output terminal electrically coupled with a gate electrode of the nitride-based transistor;
 a first voltage generating circuit electrically coupled with the main output terminal, wherein the first voltage generating circuit is configured to generate a first voltage at the main output terminal during a predetermined time interval of a turn-on duration of a switching period; and
 a second voltage generating circuit electrically coupled with the main output terminal, wherein the second voltage generating circuit is configured to generate a second voltage at the main output terminal for turning on the nitride-based transistor during a remaining time interval of the turn-on duration of the switching period;
 wherein the predetermined time interval is ahead of the remaining time interval, and the second voltage is lower than the first voltage; and
 wherein the first voltage generating circuit comprises a first comparator, and the first comparator has a positive input terminal, a negative input terminal and an output terminal, the voltage divider circuit is electrically coupled with the positive input terminal of the first comparator, the first voltage generating circuit further comprises a first reference voltage source, and the first reference voltage source is coupled in series with a first diode at the negative input terminal of the first comparator.

17. A method for driving a nitride-based transistor, comprising:
 providing a driving circuit comprising a first voltage generating circuit and a second voltage generating circuit; and
 turning on the nitride-based transistor by providing a first voltage and a second voltage to the nitride-based transistor in sequence, wherein the first voltage is generated by the first voltage generating circuit during a predetermined time interval, the second voltage is generated by the second voltage generating circuit during a remaining time interval which is after the predetermined time interval;

wherein the second voltage is lower than the first voltage but higher than a threshold voltage of the nitride-based transistor; and wherein the first voltage generating circuit comprises a first comparator, and the first comparator has a positive input terminal, a negative input terminal and an output terminal, the voltage divider circuit is electrically coupled with the positive input terminal of the first comparator, the first voltage generating circuit further comprises a first reference voltage source, and the first reference voltage source is coupled in series with a first diode at the negative input terminal of the first comparator.

18. The method of claim 17, wherein the nitride-based transistor comprises an enhanced mode III-nitride transistor.

* * * * *